(12) United States Patent
Choi et al.

(10) Patent No.: US 7,786,498 B2
(45) Date of Patent: Aug. 31, 2010

(54) LIGHT EMITTING DEVICE AND PACKAGE HAVING THE SAME

(75) Inventors: Pun Jae Choi, Gyunggi-do (KR); Jin Hyun Lee, Gyunggi-do (KR); Si Hyuk Lee, Gyunggi-do (KR); Seon Young Myoung, Gyunggi-do (KR); Ki Yeol Park, Daegu (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 370 days.

(21) Appl. No.: 12/071,980

(22) Filed: Feb. 28, 2008

(65) Prior Publication Data

US 2008/0237622 A1 Oct. 2, 2008

(30) Foreign Application Priority Data

Mar. 29, 2007 (KR) ...................... 10-2007-0030923

(51) Int. Cl.
*H01L 33/00* (2010.01)
(52) U.S. Cl. .............................. 257/98; 257/79; 257/81; 257/82; 257/84; 257/E25.032; 257/734; 257/773; 257/774; 257/784
(58) Field of Classification Search ................. 257/734, 257/773, 774, 784, 79, 81, 82, 84, 85, 88, 257/93, 94, 98, 99, 102, 103, E25.032
See application file for complete search history.

(56) References Cited

U.S. PATENT DOCUMENTS 6,459,100 B1 10/2002 Doverspike et al.

6,828,596 B2 12/2004 Steigerwald et al.
2007/0042520 A1 2/2007 Oh et al.

FOREIGN PATENT DOCUMENTS

| JP | 61-252676 | 11/1986 |
|---|---|---|
| JP | 2004-079972 | 3/2004 |
| KR | 10-2007-0020840 | 2/2007 |
| KR | 10-2007-0042214 | 4/2007 |
| WO | WO 01/41219 A1 | 6/2001 |

OTHER PUBLICATIONS

Machine Translation of JP #2004-079972.*
Korean Office Action, with English translation, issued in Korean Patent Application No. 10-2007-0030923, dated Jul. 23, 2008.

* cited by examiner

*Primary Examiner*—Steven Loke
*Assistant Examiner*—Suberr Chi
(74) *Attorney, Agent, or Firm*—McDermott Will & Emery LLP

(57) ABSTRACT

There is provided a light emitting device that can minimize reflection or absorption of emitted light, maximize luminous efficiency with the maximum light emitting area, enable uniform current spreading with a small area electrode, and enable mass production at low cost with high reliability and high quality. A light emitting device according to an aspect of the invention includes a light emitting lamination including a first conductivity type semiconductor layer, a second conductivity type semiconductor layer, and an active layer, and a conductive substrate at one surface thereof. Here, the light emitting device includes a barrier unit separating the light emitting lamination into a plurality of light emitting regions, a first electrode structure, and a second electrode structure. The first electrode structure includes a bonding unit, contact holes, and a wiring unit connecting the bonding unit to the contact holes.

16 Claims, 12 Drawing Sheets

LIGHT EMITTING DEVICE AND PACKAGE HAVING THE SAME

CROSS-REFERENCE TO RELATED APPLICATIONS

This application claims the priority of Korean Patent Application No. 2007-30923 filed on Mar. 29, 2007, in the Korean Intellectual Property Office, the disclosure of which is incorporated herein by reference.

BACKGROUND OF THE INVENTION

1. Field of the Invention

The present invention relates to a light emitting device, and more particularly, to a light emitting device that can minimize reflection or absorption of emitted light, maximize luminous efficiency with the maximum light emitting area, enable uniform current spreading with a small area electrode, and enable mass production at low cost with high reliability and high quality.

2. Description of the Related Art

Light emitting devices include materials that emit light. For example, light emitting diodes (LEDs) are devices that use diodes, to which semiconductors are bonded, convert energy generated by combination of electrons and holes into light, and emit light. The light emitting devices are being widely used as lighting, display devices, and light sources, and development of the light emitting device has been expedited.

In particular, the widespread use of cellular phone keypads, side viewers, and camera flashes, which use GaN-based light emitting diodes that have been actively developed and widely used in recent years, contributed to the active development of general illumination that uses light emitting diodes. Applications of the light emitting diodes, such as backlight units of large TVs, headlights of cars, and general illumination have advanced from small portable products to large products having high power, high efficiency, and high reliability. Therefore, there has been a need for light sources that have characteristics required for the corresponding products.

In general, a semiconductor junction light emitting device has P-type and n-type semiconductor junction structures. In the semiconductor junction structure, light may be emitted by recombination of electrons and holes at a region where the two types of semiconductors are bonded to each other. In order to activate the light emission, an active layer may be formed. The light emitting device having the semiconductor junctions includes a horizontal structure and a vertical structure according to the position of electrodes for semiconductor layers. The vertical structure includes an epi-up structure and a flip-chip structure. As described above, structural characteristics of light emitting devices that are required according to characteristics of individual products are seriously taken into account.

FIGS. 1A and 1B are views illustrating a horizontal light emitting device according to the related art. FIG. 1C is a cross-sectional view illustrating a vertical light emitting device according to the related art. For the convenience of explanation, a description will be made on the assumption that an n-type semiconductor layer is in contact with a substrate, and a p-type semiconductor layer is formed on an active layer.

First, an epi-up light emitting device of a horizontal light emitting device will be described with reference to FIG. 1A.

A light emitting device 1 includes a non-conductive substrate 13, an n-type semiconductor layer 12, an active layer 11, and a p-type semiconductor layer 10. An n-type electrode 15 and a p-type electrode 14 are formed on the n-type semiconductor layer 12 and the p-type semiconductor layer 10, respectively, and, are connected to an external current source (not shown) to apply a voltage.

When a voltage is applied to the light emitting device 1 through the electrodes 14 and 15, electrons move from the n-type semiconductor layer 12, and holes move from the p-type semiconductor layer 10. Light is emitted by recombination of the electrons and the holes. The light emitting device 1 includes the active layer 11, and light is emitted from the active layer 11. In the active layer 11, the light emission of the light emitting device 1 is activated, and light is emitted. In order to make an electrical connection, the n-type electrode and the p-type electrode are located on the n-type semiconductor layer 12 and the p-type semiconductor layer 10, respectively, with the lowest contact resistance values.

The position of the electrode may be changed according to the substrate type. For example, when the substrate 13 is a sapphire substrate that is a non-conductive substrate, the electrode of the n-type semiconductor layer 12 cannot be formed on the non-conductive substrate 13, but on the n-type semiconductor layer 12.

Therefore, referring to FIG. 1A, when the n-type electrode 15 is formed on the n-type semiconductor 12, parts of the p-type semiconductor layer 10 and the active layer 12 that are formed at the upper side are consumed to form an ohmic contact. The formation of the electrode results in a decrease of light emitting area of the light emitting device 1, and thus luminous efficiency also decreases.

In FIG. 1B, a horizontal light emitting device has a structure that increases luminous efficiency. The light emitting device, shown in FIG. 1B, is a flip chip light emitting device 2. A substrate 23 is located at the top. Electrodes 24 and 25 are in contact with electrode contacts 26 and 27, respectively, which are formed on a conductive substrate 28. Light emitted from an active layer 21 is emitted through the substrate 23 regardless of the electrodes 24 and 25. Therefore, the decrease in luminous efficiency that is caused in the light emitting device, shown in FIGS. 1A and 1B, can be prevented.

However, despite the high luminous efficiency of the flip chip light emitting device 2, the n-type electrode and the p-type electrode in the light emitting device 2 need to be disposed in the same plane and bonded. After being bonded, the n-type electrode and the p-type electrode are more likely to be separated from the electrode contacts 26 and 27. For this reason, there is a need for expensive precision processing equipment. This causes an increase in manufacturing costs, a decrease in productivity, a decrease in yield, and a decrease in product reliability.

In order to solve a variety of problems including the above-described problems, a vertical light emitting device that uses a conductive substrate, not the non-conductive substrate, appeared. A light emitting device 3, shown in FIG. 1C, is a vertical light emitting device. When a conductive substrate 33 is used, an n-type electrode 35 may be formed on the substrate 33. The conductive substrate 33 may be formed of a conductive material, for example, Si. In general, it is difficult to form light emitting layers, which include semiconductor layers and an active layer, on the conductive substrate due to lattice-mismatching. Therefore, the light emitting layers grow by using a substrate that allows easy growth of the light emitting layers, and then a conductive substrate is bonded after removing the substrate for growth.

Referring to FIG. 1D, after light emitting layers 30, 31, and 32 are formed, a non-conductive substrate 36 is separated by using a laser. When the laser is irradiated to the non-conductive substrate 36, energy from the laser is absorbed by the semiconductor formed along the boundary between the non-conductive substrate 36 and the p-type semiconductor layer 30. The semiconductor is melted such that the non-conductive substrate 36 is separated from the p-type semiconductor layer 30.

When the non-conductive substrate 36 is removed, the conductive substrate 33 is formed on the n-type semiconductor layer 32, such that the light emitting device 3 has a vertical light emitting structure. When the conductive substrate 33 is used, since a voltage can be applied to the n-type semiconductor layer 32 through the conductive substrate 33, an electrode can be formed on the substrate 33. Therefore, as shown in FIG. 1C, the n-type electrode 35 is formed on the conductive substrate 33, and the p-type electrode 34 is formed on the p-type semiconductor layer 30, such that the light emitting device having the vertical structure can be manufactured.

However, when a high-power light emitting device having a large area is manufactured, an area ratio of the electrode to the substrate needs to be high for current spreading. Therefore, light extraction is limited, light loss is caused by optical absorption, and luminous efficiency decreases. Further, heat, which is generated due to the absorption of the laser energy that is generally used when removing the non-conductive substrate, causes expansion and contraction of the substrate and the semiconductor layers. Stress is applied to each of the layers due to the thermal expansion coefficient and the time difference according to heat transfer. The stress is in proportion to the contact area of the substrate and the semiconductor layers. Therefore, reliability of the large area light emitting device is adversely affected.

SUMMARY OF THE INVENTION

An aspect of the present invention provides a high quality light emitting device that can minimize reflection or absorption of emitted light, maximize luminous efficiency with the maximum light emitting area, enable uniform current spreading with a small area electrode, and enable mass production at low cost with high reliability and high quality.

According to an aspect of the present invention, there is provided a light emitting device including: a light emitting lamination first and second conductivity type semiconductor layers and an active layer formed therebetween, and a first and second surfaces opposite to each other and provided as the first and second conductivity type semiconductor layers; at least one insulating barrier unit extending from the second surface of the light emitting lamination to part of the first conductivity type semiconductor layer so as to divide the light emitting lamination into a plurality of light emitting regions; a first electrode structure connected to the first conductivity type semiconductor layer located at the plurality of light emitting regions; a second electrode structure formed at the second surface of the light emitting lamination so as to be connected to the second conductivity type semiconductor layer; and a conductive substrate formed at the second surface of the light emitting lamination so as to be electrically connected to the second electrode structure.

According to this construction, the first electrode structure includes: a plurality of contact holes respectively provided in the plurality of light emitting regions and extending from the second surface of the light emitting lamination to at least part of the first conductivity type semiconductor layer so that the plurality of contact holes are electrically connected to the first conductivity type semiconductor layer and electrically insulated from the second conductivity type semiconductor layer and the active layer, a bonding unit connected from the first surface of the light emitting lamination to at least one of the plurality of contact holes with conductive material formed therein, and having a bonding region exposed at the first surface, and a wiring unit formed in the second surface of the light emitting lamination, electrically insulated from at least the second conductivity type semiconductor layer, and electrically connecting one contact hole with conductive material formed therein connected to the bonding unit to another contact hole with conductive material formed therein.

The barrier unit electrically insulating the semiconductor layers and the active layers may be filled with air. The barrier unit may have an insulating layer formed at an inner surface thereof or be filled with an insulating material. The barrier unit may extend from the second surface of the light emitting lamination to the first conductivity type semiconductor layer. The barrier unit may include one structure or a plurality of barriers separated from each other.

The second electrode may reflect light generated from the active layer. The second electrode structure may include any one of Ag, Al, and Pt.

The conductive substrate may be a metallic substrate that includes any one of Au, Ni, Cu, and W. The conductive substrate may be a semiconductor substrate that includes any one of Si, Ge, and GaAs. The conductive substrate may be formed by using a plating method or a substrate bonding method.

A cross section of the bonding unit crossing the active layer may be smaller than that of the bonding unit crossing the second conductivity type semiconductor layer.

A cross section of the contact hole with conductive material formed therein crossing the active layer may be smaller than that of the bonding unit crossing the active layer.

According to another aspect of the present invention, there is provided a light emitting device package including: a light emitting device package body having a recessed part at an upper surface thereof; a first lead frame mounted to the package body and exposed at a lower surface of the recessed part; a second lead frame mounted to the package body; and a light emitting device mounted to the first lead frame. Here, the light emitting device includes a light emitting lamination including a first conductivity type semiconductor layer, a second conductivity type semiconductor layer, and an active layer, a conductive substrate at one surface thereof, a barrier unit separating the light emitting lamination into a plurality of light emitting regions, a first electrode structure, and a second electrode structure. Here, the first electrode structure includes a bonding unit, contact holes with conductive material formed therein, and a wiring unit connecting the bonding unit to the contact holes with conductive material formed.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1A:
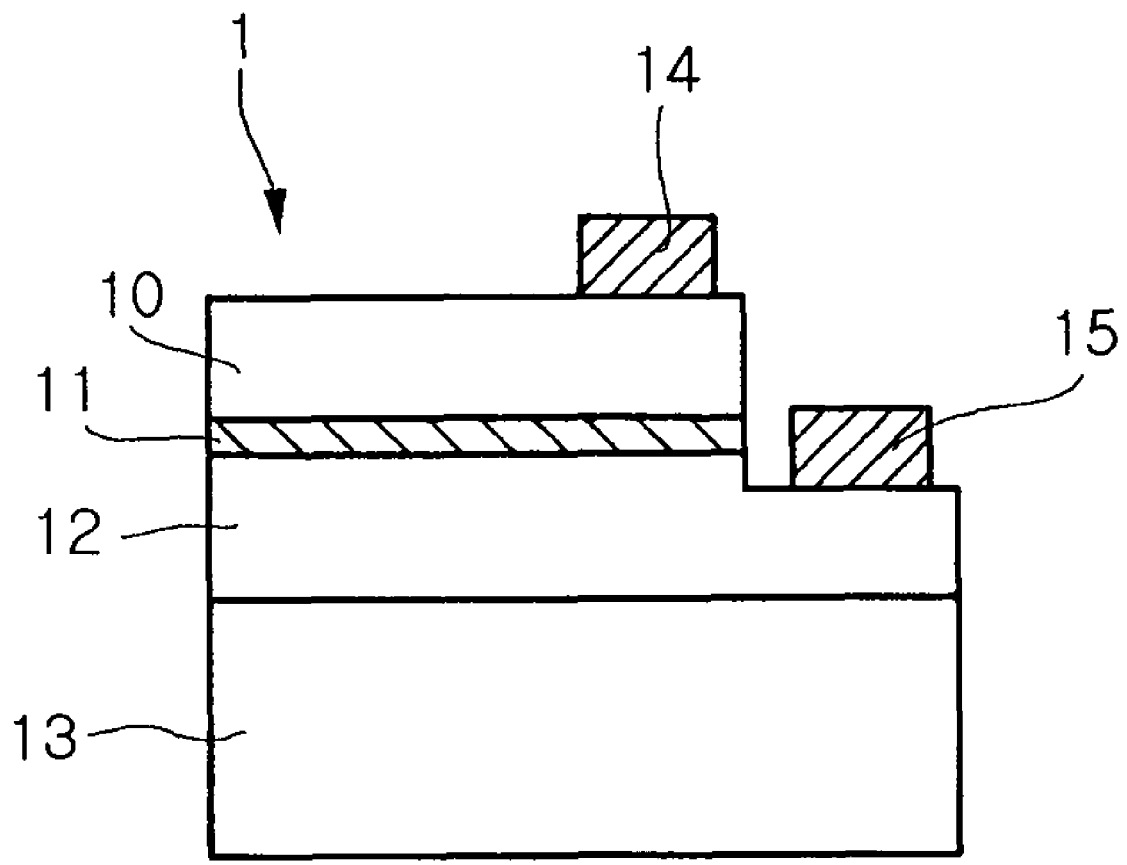
FIG. 1A is a cross-sectional view illustrating a horizontal light emitting device according to the related art.
Figure 1B:
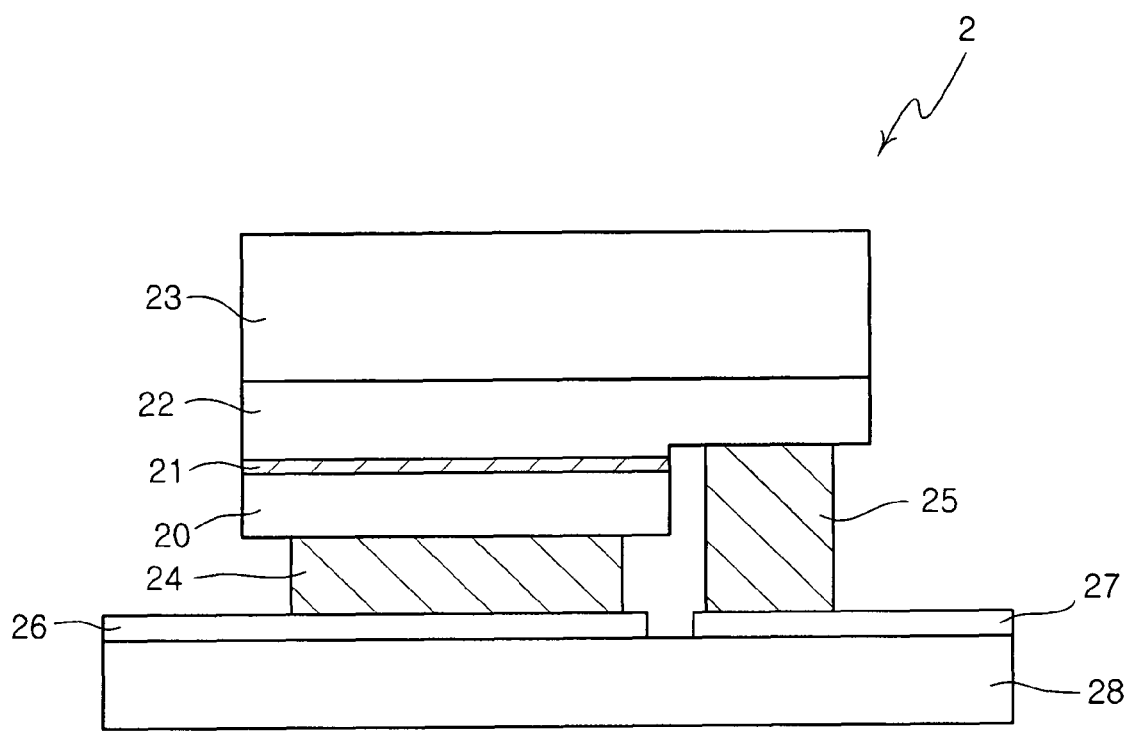
FIG. 1B is a cross-sectional view illustrating a horizontal light emitting device according to the related art.
Figure 1C:
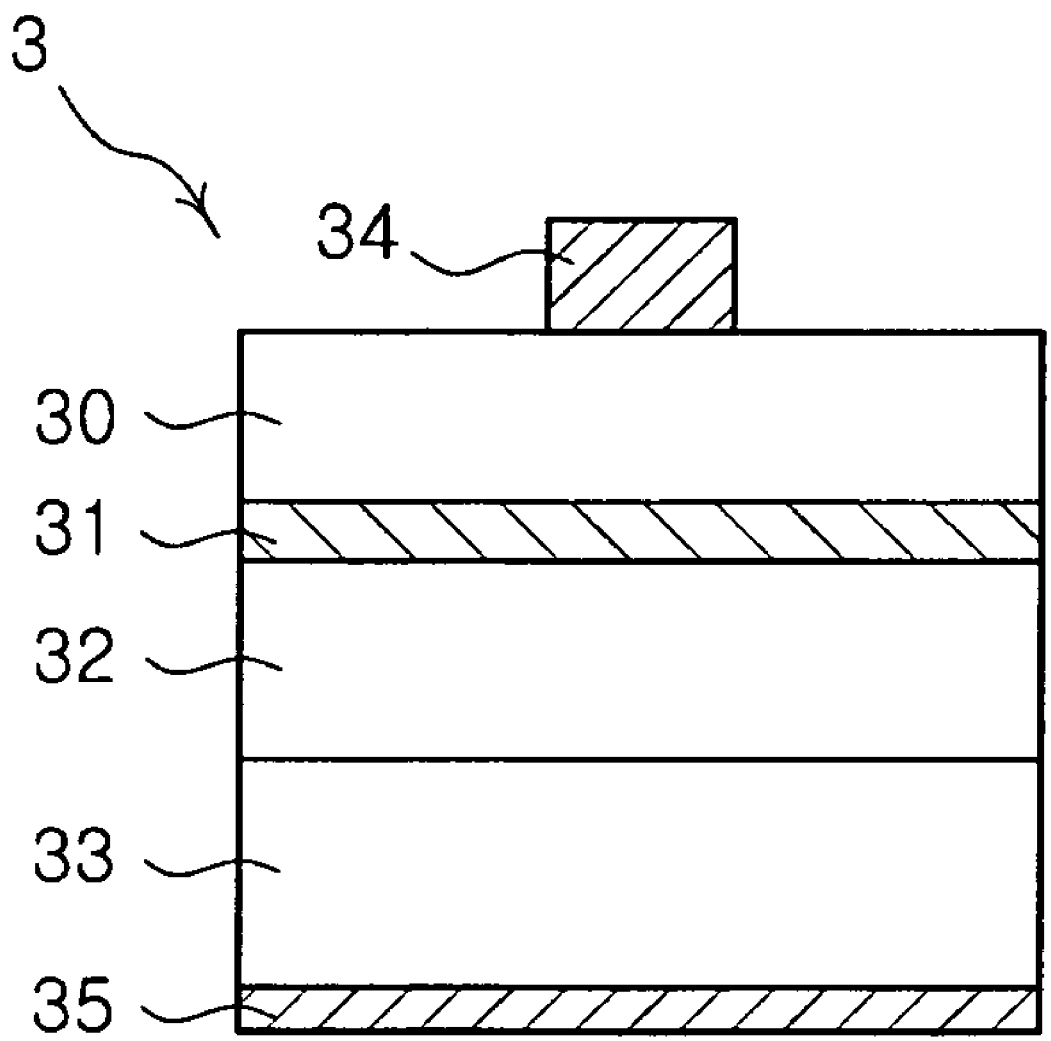
FIG. 1C is a cross-sectional view illustrating a vertical light emitting device according to the related art.
Figure 1D:
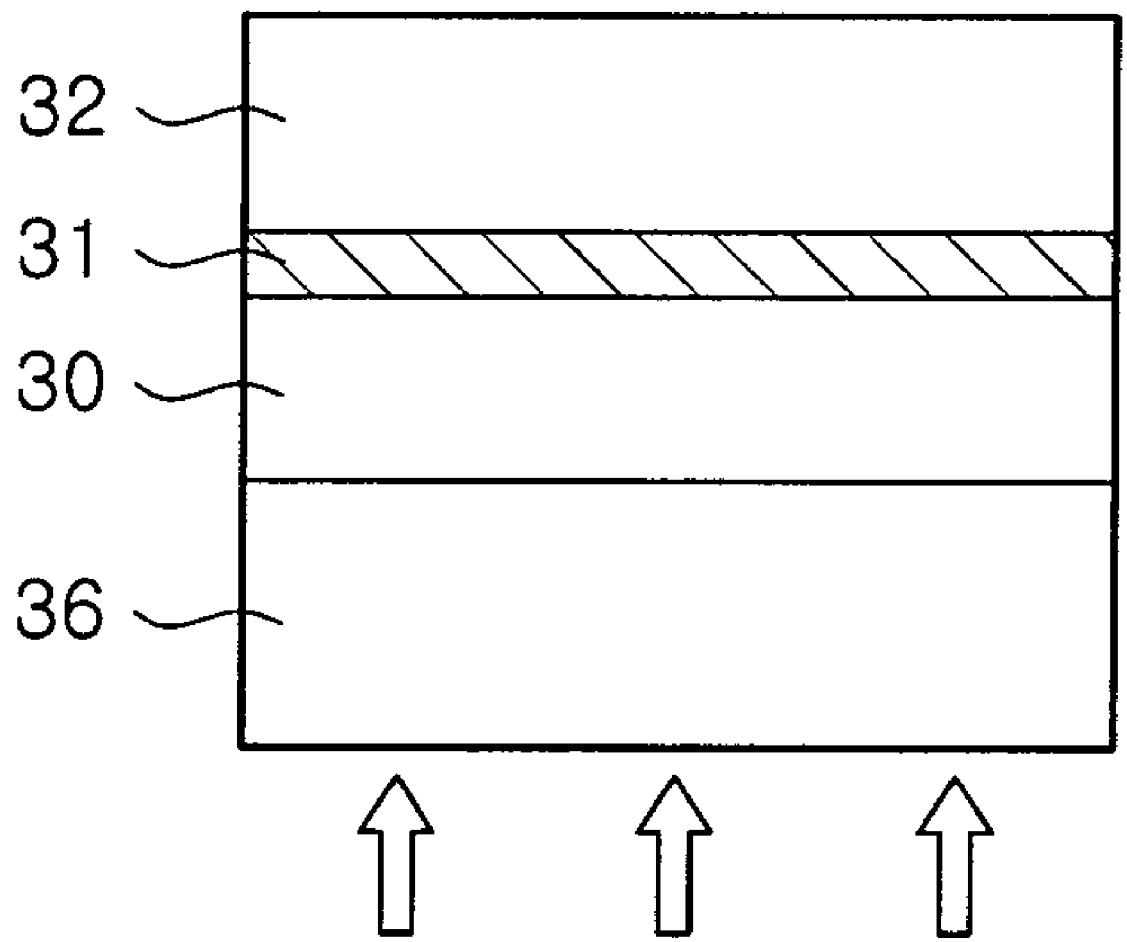
FIG. 1D is a view illustrating a state in which a substrate is separated from the vertical light emitting device of FIG. 1C.
Figure 2:
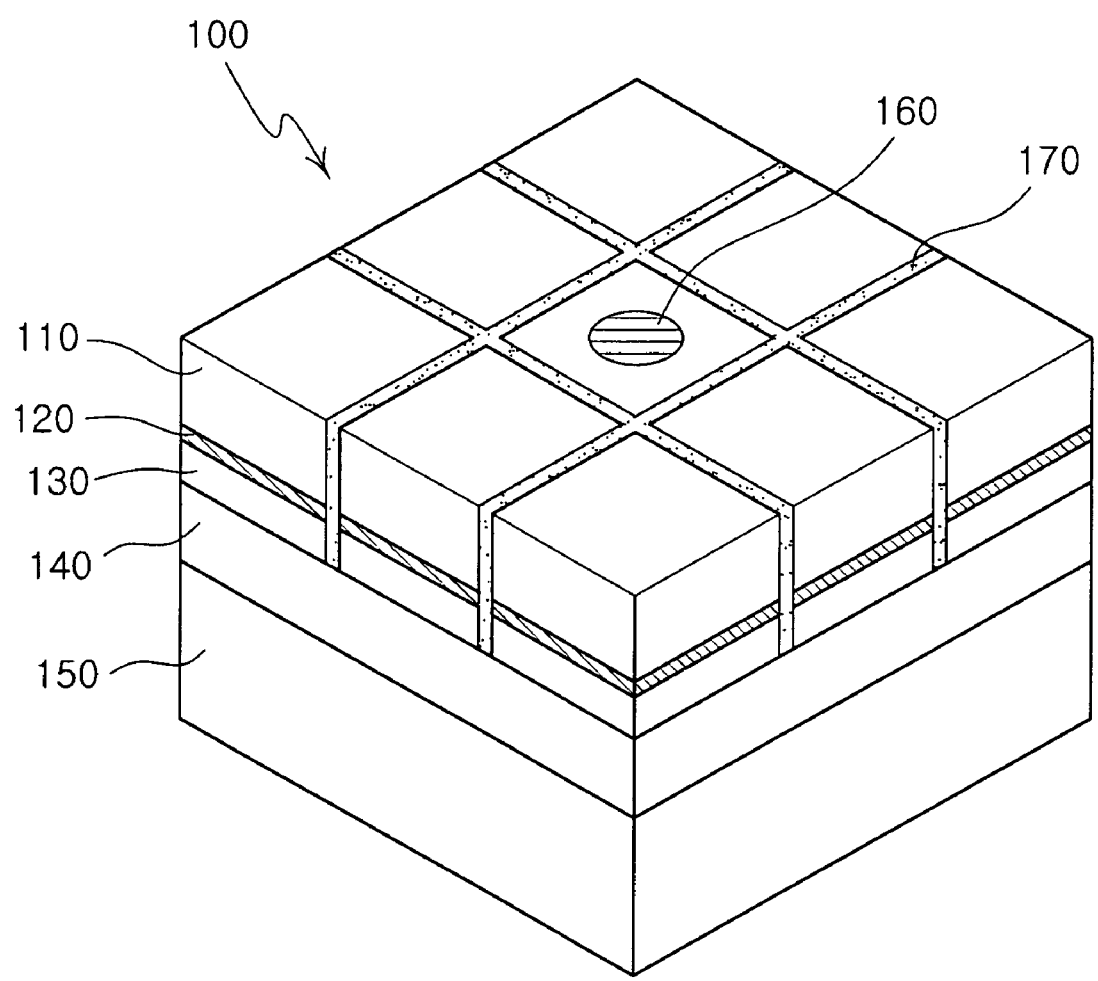
FIG. 2 is a perspective view illustrating a light emitting device according to one exemplary embodiment of the present invention.
Figure 3A:
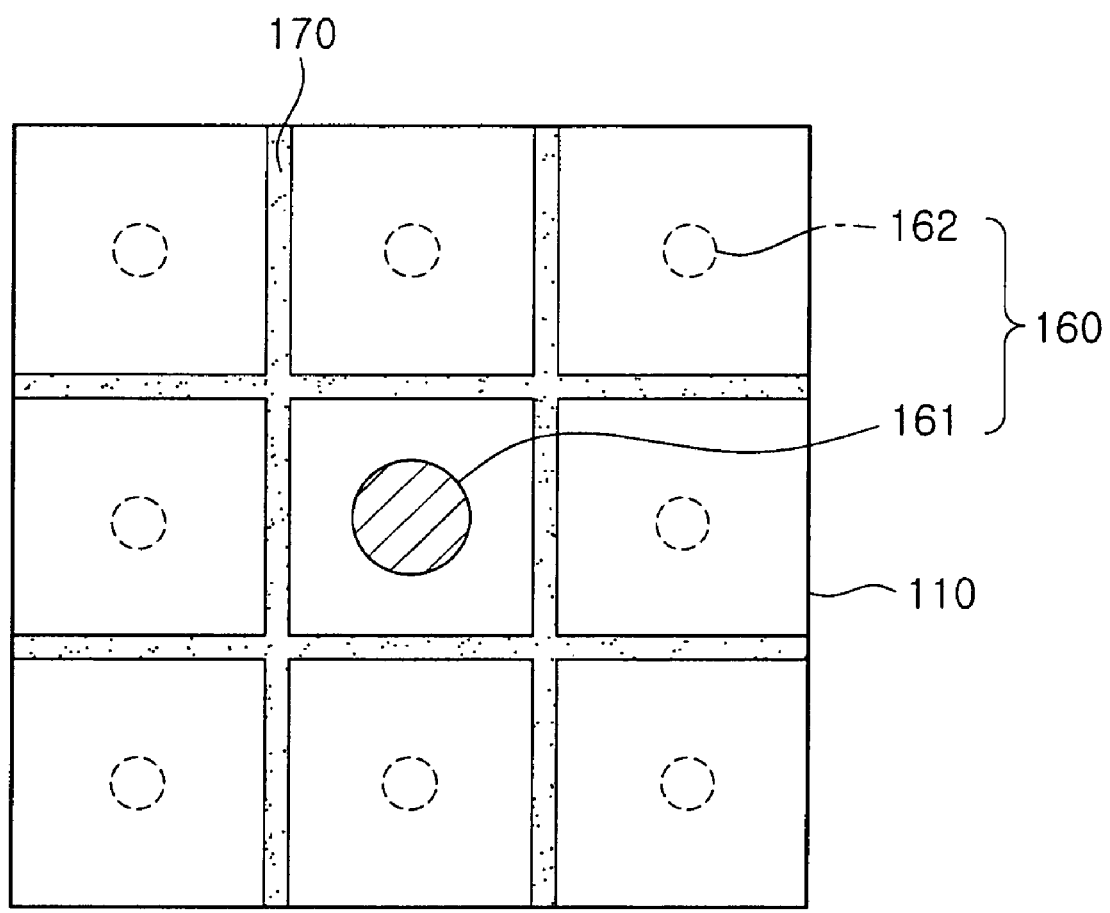
FIG. 3A is a top view illustrating the light emitting device shown in FIG. 2.
Figure 3B:
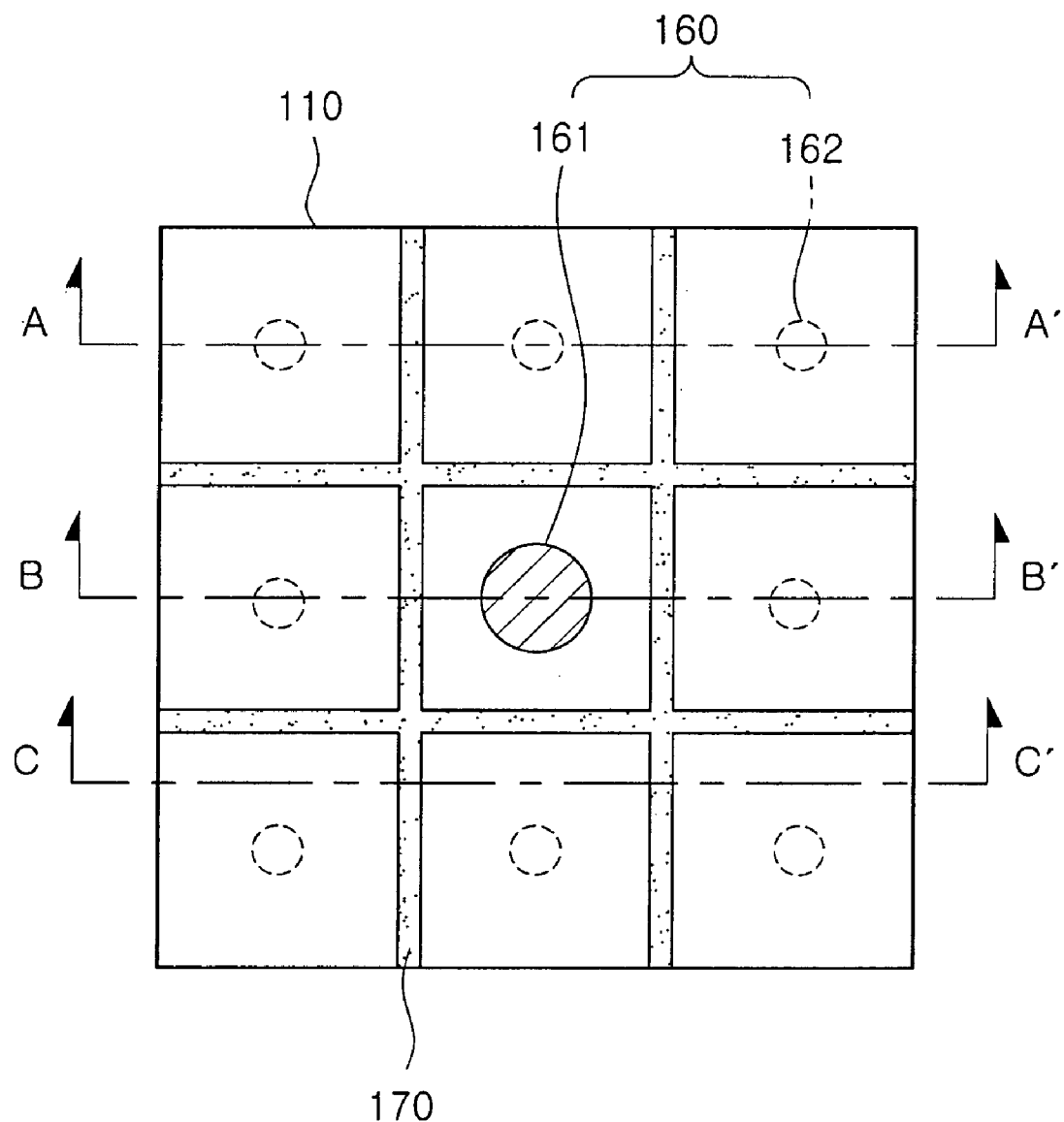
FIG. 3B is a top view illustrating the light emitting device shown in FIG. 2.
Figure 4A:
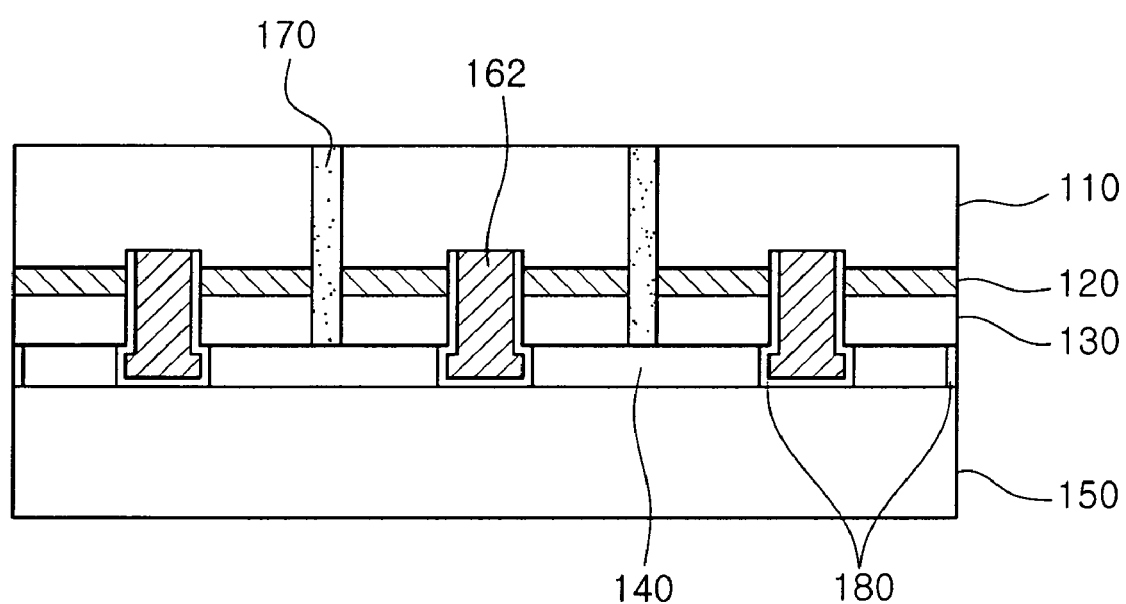
FIG. 4A is a cross-sectional view illustrating the light emitting device, shown in FIG. 3B, taken along the line A-A'.
Figure 4B:
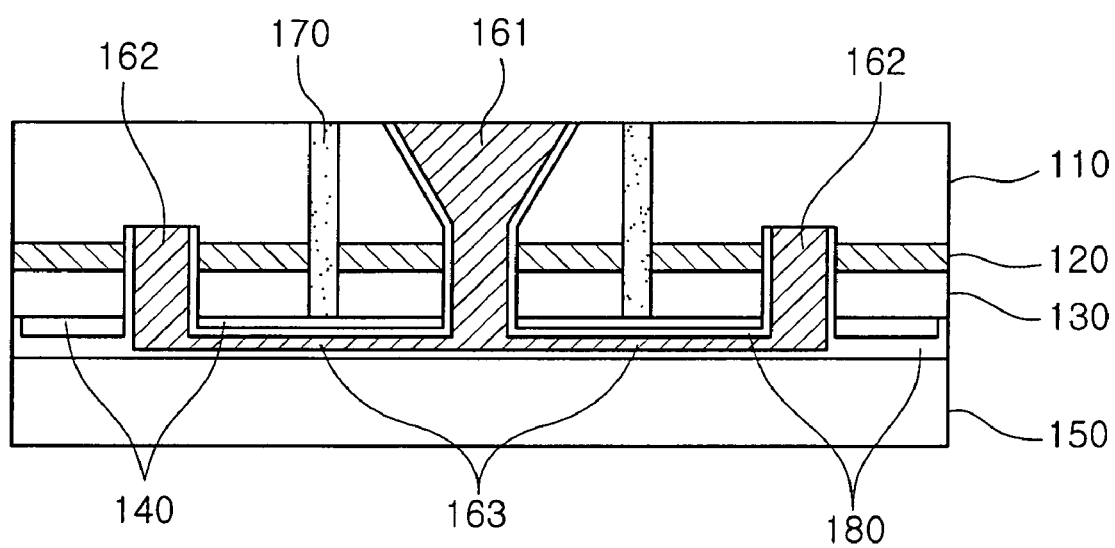
FIG. 4B is a cross-sectional view illustrating the light emitting device, shown in FIG. 3B, taken along the line B-B'.
Figure 4C:
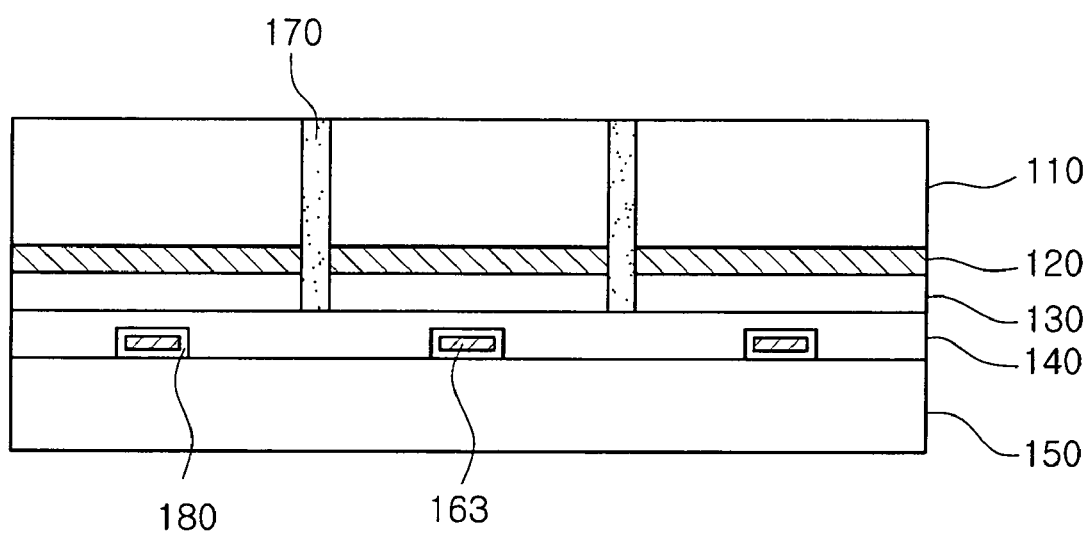
FIG. 4C is a cross-sectional view illustrating the light emitting device, shown in FIG. 3B, taken along the line C-C'.

FIG. 2 is a cross-sectional view illustrating a light emitting device according to one exemplary embodiment of the present invention. FIGS. 3A and 3B are top views illustrating the light emitting device shown in FIG. 2. FIGS. 4A, 4B, and 4C are cross-sectional views illustrating the light emitting device, shown in FIG. 3B, taken along the lines A-A', B-B', and C-C', respectively.

A light emitting device 100 according to the exemplary embodiment of the invention includes first and second conductivity type semiconductor layers 110 and 130, and an active layer 120 formed therebetween. The light emitting device 100 includes a light emitting lamination 110, 120, and 130, at least one barrier unit 170, a first electrode structure 160, a second electrode structure 140, and a conductive substrate 150. The light emitting lamination 110, 120, and 130 has a first surface and a second surface opposite to each other and provided as the first and second conductivity type semiconductor layers 110 and 130. The barrier unit 170 extends from the second surface of the light emitting lamination 110, 120, and 130 to at least part of the first conductivity type semiconductor layer 110 to divide light emitting lamination 110, 120, and 130 into a plurality of light emitting regions. The first electrode structure 160 is connected to the first conductivity type semiconductor layer 110 that is located at the plurality of light emitting regions. The second electrode structure 140 is formed on the second surface of the light emitting lamination 110, 120, and 130 so as to be connected to the second conductivity type semiconductor layer 130. The conductive substrate 150 is formed on the second surface of the light emitting lamination 110, 120, and 130 so as to be electrically connected to the second electrode structure 140.

The light emitting lamination 110, 120, and 130 includes the first and second conductivity type semiconductor layers 110 and 130 and the active layer 120 formed therebetween. The light emitting lamination 110, 120, and 130 has an outer surface of first conductivity type semiconductor layer 110 that serves as the first surface and an outer surface of the second conductivity type semiconductor layer 130 that serves as the second surface.

Each of the semiconductor layers 110 and 130 may be formed of a semiconductor, such as a GaN-based semiconductor, a ZnO-based semiconductor, a GaAs-based semiconductor, a GaP-based semiconductor, and a GaAsP-based semiconductor. The semiconductor layer may be formed by using, for example, molecular beam epitaxy (MBE). In addition, each of the semiconductor layers may be formed of any one of semiconductors, such as a III-V semiconductor, a II-VI semiconductor, and Si. The light emitting lamination can grow from a non-conductive substrate (not shown) that has relatively small lattice-mismatching. The non-conductive substrate (not shown) is removed later before a conductive substrate is bonded.

The active layer 120 is a layer where light emission is activated. The active layer 120 is formed of a material that has a smaller energy bandgap than each of the first conductivity type semiconductor layer 110 and the second conductivity type semiconductor layer 130. For example, when each of the first conductivity type semiconductor layer 110 and the second conductivity type semiconductor layer 130 is formed of a GaN-based compound, the active layer 120 may be formed by using a InAlGaN-based compound semiconductor that has a smaller energy bandgap than GaN. That is, the active layer 120 may include $In_xAl_yGa_{(1-x-y)}N$ ($0 \leq x \leq 1$, $0 \leq y \leq 1$, $0 \leq x+y \leq 1$).

In consideration of characteristics of the active layer 120, the active layer 120 is preferably not doped with impurities. A wavelength of emitted light can be controlled by adjusting a mole ratio of constituents. Therefore, the light emitting device 100 can emit any one of infrared light, visible light, and UV light according to the characteristics of the active layer 120.

An energy well structure appears in the entire energy band diagram of the light emitting device 100 according to the active layer 120. The electrons and the holes from the semiconductor layers 110 and 130, respectively, are moving and trapped within the energy well structure, which results in higher luminous efficiency.

The barrier unit 170 extends from the second surface of the light emitting lamination 110, 120, and 130 to at least part of the first conductivity type semiconductor layer 110 such that light emitting lamination 110, 120, and 130 is divided into the plurality of light emitting regions. The barrier unit 170 divides the first conductivity type semiconductor layer 110 into a plurality of regions. When a separating unit, such as a laser, is used between the first conductivity type semiconductor layer 110 and a substrate for growth (not shown) formed on the first conductivity type semiconductor layer 110, the barrier unit 170 reduces stress that is generated due to heat energy applied to the interface therebetween.

For example, when the laser is used as the separating unit for separating the first conductivity type semiconductor layer 110 from the substrate for growth, temperature at the interface is approximately 1000° C. Heat energy from the laser separates them from each other. However, the heat generates stress that induces contraction and expansion of the semiconductor layers and the conductive substrate 150 to be bonded later. In general, since the multitude of stress is in proportion to the area, the stress may adversely affect a large area light limiting device.

However, since the light emitting device 100 according to the embodiment of the invention includes the barrier unit 170, the area of the first conductivity type semiconductor layer 110 is divided into a plurality of small areas of the plurality of light emitting regions to thereby reduce the stress. That is, the expansion and the contraction are more easily performed according to the plurality of light emitting regions, such that light emission of the light emitting lamination 110, 120, and 130 can be stabilized.

Preferably, the barrier unit 170 electrically insulates the semiconductor layers 110 and 130, and the active layer 120. To do so, the barrier unit may be filled with air. Alternatively, the barrier unit 170 may include an insulating layer, which is filled with air. Further, the entire barrier unit may be filled with an insulating material, such as a dielectric, to achieve electrical insulation.

In order to electrically insulate the light emitting lamination 110 and 130, the barrier unit 170 may extend from the second surface to the top surface of the first conductivity type semiconductor layer 110. However, the first conductivity type semiconductor layer 110 does not necessarily extend to the top surface of the first conductivity type semiconductor layer 110. The barrier unit 170 may extend within the conductivity type semiconductor layer 110.

Further, the barrier unit 170 may have one structure. Alternatively, the barrier unit 170 may include a plurality of barriers that are separated from each other. In this case, the plurality of barriers may appear different from each other. For example, the barrier that surrounds a bonding unit 161 and a barrier that surrounds a contact hole with conductive material formed therein 162 may be different in height and shape.

The first electrode structure 160 is connected to the first conductivity type semiconductor layer 110 that is located at the plurality of light emitting regions that are separated from each other by the barrier unit 170. The first electrode structure 160 includes the contact hole with conductive material formed therein 162, the bonding unit 161, and a wiring unit 163.

There may be a plurality of contact holes with conductive material formed therein 162. Each of the plurality of contact holes with conductive material formed therein 162 may be formed in each of the plurality of light emitting regions. A single contact hole with conductive material formed therein 162 may be formed in a single light emitting region or a plurality of contact holes with conductive material formed therein may be formed in a single light emitting region. While the contact holes with conductive material formed therein 162 are electrically connected to the first conductivity type semiconductor layer 110, the contact holes with conductive material formed therein 162 are electrically insulated from the second conductivity type semiconductor layer 130 and the active layer 120. To do so, the contact hole with conductive material formed therein 162 extends from the second surface of the light emitting lamination 110, 120, and 130 to at least part of the first conductivity type semiconductor layer 110. The contact holes with conductive material formed therein 162 are formed to spread the current in the first conductivity type semiconductor layer 110.

The bonding unit 161 from the first surface of the light emitting lamination 110, 120, and 130 is connected to at least one of the plurality of contact holes 162. A region that is exposed at the first surface is provided as a bonding region.

The wiring unit 163 is formed at the second surface of the light emitting lamination 110, 120, and 130. Further, while the wiring unit 163 is electrically insulated from at least the second conductivity type semiconductor layer 130, the wiring unit 163 electrically connects one contact hole with conductive material formed therein 162, which is connected to the bonding unit 161, and another contact hole with conductive material formed therein 162. Further, the wiring unit 163 may connect the contact holes with conductive material formed therein 162 to the bonding unit 161. The wiring unit 163 is located below the first conductivity type semiconductor layer 110 and the active layer 120 so as to increase luminous efficiency.

Hereinafter, the contact holes with conductive material formed therein 162, the bonding unit 161, and the wiring unit 163 will be described in more detail with reference to FIGS. 3A to 4C.

The second electrode structure 140 is formed on the second surface of the light emitting lamination 110, 120, and 130 so as to be electrically connected to the second conductivity type semiconductor layer 130. That is, the second electrode structure 140 has an electrode that electrically connects the second conductivity type semiconductor layer 130 to an external current source (not shown). The second electrode structure 140 may be formed of metal. The second electrode structure 140 may be formed of Ti as an n-type electrode, and Pd or Au as a p-type electrode.

Preferably, the second electrode structure 140 reflects light generated from the active layer 120. Since the second electrode structure 140 is located below the active layer 120, the second electrode structure 140 is located at a surface opposite to a direction, in which the light emitting device emits light, on the basis of the active layer 120. Therefore, light moving from the active layer 120 to the second electrode structure 140 is opposite to the light emitting direction. Therefore, the light needs to be reflected to increase luminous efficiency. The light reflected by the second electrode structure 140 moves toward a light emitting surface, thereby increasing luminous efficiency of the light emitting device.

In order to reflect the light generated from the active layer 120, the second electrode structure 140 is preferably formed of metals that appear white in the visible ray region. For example, the white metal may be any one of Ag, Al, and Pt. The second electrode structure 140 will be described below in more detail with reference to FIGS. 4A to 4C.

The conductive substrate 150 is connected to the second surface of the light emitting lamination 110, 120, and 130 so as to be electrically connected to the second electrode structure 140. The conductive substrate 150 may be a metallic substrate or a semiconductor substrate. When the conductive substrate 150 is the metallic substrate, the conductive substrate 150 may be formed of any one of metals, such as Au, Ni, Cu, and W. Further, when the conductive substrate 150 is the semiconductor substrate, the conductive substrate 150 may be formed of any one of semiconductors, Si, Ge, and GaAs. Examples of a method of forming a conductive substrate in a light limiting device includes a plating method of forming a plating seed layer to form a substrate and a substrate bonding method of separately preparing a conductive substrate 150 and bonding the conductive substrate 150 by using a conductive adhesive, such as Au, Au—Sn, and Pb—Sr.

Referring to FIG. 3A, the bonding unit 161 is formed at the surface of the first conductivity type semiconductor layer 110, and the plurality of contact holes with conductive material formed therein 162, indicated by dashed line, are located inside the first conductivity type semiconductor layer 110. The first conductivity type semiconductor layer 110 includes the plurality of light emitting regions that are separated from each other by the barrier unit 170. In FIGS. 3A and 3B, only one bonding unit 161 is shown. However, a plurality of bonding units may be formed on the same light emitting region or a plurality of bonding units may be formed on each of the plurality of light emitting regions. Further, each of the contact holes with conductive material formed therein 162 is formed in each of the light emitting regions. However, the plurality of contact holes with conductive material formed therein 162 may be formed on a single light emitting region to thereby improve current spreading.

In FIG. 3B, the top surface of the first conductivity type semiconductor layer 110, shown in FIG. 3A, is taken along the lines A-A', B-B', and C-C'. The line A-A' is determined to show a section that only includes the contact holes with conductive material formed therein 162. The line B-B' is determined to show a section that includes the bonding unit 161 and the contact holes with conductive material formed therein 162. The line C-C' is determined to show a section that only includes the wiring unit 163 and does not include the contact holes with conductive material formed therein 162 and the bonding unit 161.

FIGS. 4A to 4C are cross-sectional views illustrating the light emitting device, shown in FIG. 3B, taken along the lines A-A', B-B', and C-C'. Hereinafter, a description will be made with reference to FIGS. 2, 3A, 3B, and 4A to 4C.

In FIG. 4A, each of the contact holes with conductive material formed therein 162 extends from the second electrode structure 140 to the inside of the first conductivity type semiconductor layer 110. The contact holes with conductive material formed therein 162 extend from the second electrode structure 140 to the first conductivity type semiconductor layer 110 through the second conductivity type semiconductor layer 130 and the active layer 120. The contact holes with conductive material formed therein 162 extend to at least part of the first conductivity type semiconductor layer 110. Contrary to the bonding unit 161, the contact hole with conductive material formed therein 162 does not need to extend to the surface of the first conductivity type semiconductor layer 110. Since the contact holes with conductive material formed therein 162 are formed to spread the current in the first conductivity type semiconductor layer 110, the contact holes with conductive material formed therein 162 need to extend to the first conductivity type semiconductor layer 110.

The contact hole with conductive material formed therein 162 needs to have a predetermined area to spread the current in the first conductivity type semiconductor layer 110. Contrary to the bonding unit 161, the contact hole with conductive material formed therein 162 is not formed for an electrical connection. Therefore, the contact holes with conductive material formed therein 162 are formed by a predetermined number so that each of the contact holes with conductive material formed therein 162 has an area small enough to allow uniform current spreading in the first conductivity type semiconductor layer 110. A small number of contact holes with conductive material formed therein 162 may cause deterioration in electrical characteristics due to non-uniform current spreading. A large number of contact holes with conductive material formed therein 162 may cause a decrease in light emitting area due to difficulties in forming the contact holes with conductive material formed therein 162 and a decrease in area of the active layer. Therefore, the number of contact holes with conductive material formed therein 162 may be appropriately determined in considerations of these facts. Each of the contact holes with conductive material formed therein 162 is formed to have as small area as possible and allow uniform current spreading.

Preferably, the plurality of contact holes with conductive material formed therein 162 are formed for current spreading. Further, the contact hole with conductive material formed therein 162 may have a cylindrical shape. A cross-section of the contact hole with conductive material formed therein 162 may be smaller than that of the bonding unit 161. Further, the contact hole with conductive material formed therein 162 is preferably separated from the bonding unit 161 by a predetermined distance. The contact holes with conductive material formed therein 162 and the bonding unit 161 may be connected to each other in the second electrode structure 140 by the wiring unit 163 to be described below. For this reason, the contact holes with conductive material formed therein 162 are separated from the bonding unit 161 by the predetermined distance and induce uniform current spreading in the first conductivity type semiconductor layer 110.

The contact holes with conductive material formed therein 162 extend from the second electrode structure 140 to the inside of the first conductivity type semiconductor layer 110. Since the contact holes with conductive material formed therein 162 are formed to spread the current in the first conductivity type semiconductor layer, the contact holes with conductive material formed therein 162 need to be electrically separated from the second conductivity type semiconductor layer 130 and the active layer 120. Therefore, it is preferable that the contact holes with conductive material formed therein 160 be electrically separated from the second electrode structure 140, second conductivity type semiconductor layer 130, and the active layer 120. Electrical separation can be achieved by using an insulating material, such as a dielectric.

In FIG. 4B, the bonding unit 161 extends from the second electrode structure 140 to the surface of the first conductivity type semiconductor layer 110. The bonding unit 161 extends from the second electrode structure 140 to the surface of the first conductivity type semiconductor layer 110 through the second conductivity type semiconductor layer 130, the active layer 120, and the first conductivity type semiconductor layer 110. The bonding unit 161 is connected from the first surface of the light emitting lamination 110, 120, and 130 to at least one of the plurality of contact holes with conductive material formed therein 162. A region of the bonding unit 161 that is exposed at the first surface is provided as a bonding region.

Particularly, the bonding unit 161 is formed to connect the first electrode structure 160 to the external current source (not shown). Preferably, the first electrode structure 160 includes at least one bonding unit 161.

The bonding unit 161 extends from the second electrode structure 140 to the surface of the first conductivity type semiconductor layer 110. The bonding unit 161 formed at surface of the first conductivity type semiconductor layer 110 is electrically connected to the external current source so as to supply a current to the contact holes with conductive material formed therein. Therefore, preferably, the bonding unit 161 is electrically separated from the second electrode structure 140, the second conductivity type semiconductor layer 130, and the active layer 120. Electrical separation can be achieved by forming an insulating layer that is formed of an electrical material, such as a dielectric.

The bonding unit 161 supplies the current to the contact holes with conductive material formed therein 162. Further, the bonding unit 161 may be formed so that the bonding unit 161 is not electrically separated from the first conductivity type semiconductor layer 110 so as to directly spread the current. The bonding unit 161 may be electrically separated from the first conductivity type semiconductor layer 110 or not according to whether current supply to the contact holes with conductive material formed therein 162 or current spreading in the first conductivity type semiconductor layer 110 is required.

A cross section of the bonding unit 161 at the active layer 120 is preferably smaller than that of the bonding unit 161 at the surface of the first conductivity type semiconductor layer 110. In this way, the area of the active layer 120 is ensured to the maximum extent possible to increase the luminous efficiency. However, preferably, the bonding unit 161 at the surface of the first conductivity type semiconductor layer 110 has a predetermined area so as to connect the first electrode structure 160 to the external current source (not shown).

The bonding unit 161 may be located at the center of the light emitting device 100. In this case, the contact holes with conductive material formed therein 162 are preferably separated from the bonding unit 161 by the predetermined distance, and uniformly distributed. Referring to FIG. 3A, the bonding unit 161 and the contact holes with conductive material formed therein 162 are uniformly distributed over the first conductivity type semiconductor layer 110 to optimize the current spreading. In FIG. 3A, it is assumed that there are one bonding unit 161 and eight contact holes with conductive material formed therein 162. However, the number of bonding units 161 and the number of contact holes with conductive material formed therein 162 may be appropriately determined in consideration of the position of the external current source and other factors for electrical connection, and the thickness of the first conductivity type semiconductor layer 110 and other factors for current spreading.

When the plurality of contact holes with conductive material formed therein 162 are formed, the bonding unit 161 may be directly connected to each of the plurality of contact holes with conductive material formed therein 162. In this case, the bonding unit 161 is formed at the center of the light emitting device 100, and the contact holes with conductive material formed therein 162 are formed around the bonding unit 161. Further, the wiring unit 163 may directly connect the bonding unit 161 and the contact holes with conductive material formed therein 162 in a radial direction.

Alternatively, some of the plurality of contact holes with conductive material formed therein 162 may be directly connected to the bonding unit 161. Other contact holes with conductive material formed therein 162 may be connected to the contact holes with conductive material formed therein 162 that are directly connected to the bonding unit 161, such that the contact holes with conductive material formed therein 162 are indirectly connected to the bonding unit 161. In this way, a larger number of contact holes with conductive material formed therein 162 can be formed to thereby increase the efficiency of current spreading.

In FIGS. 4A to 4C, the wiring unit 163 is formed in the second electrode structure 140 and connects the bonding unit 161 and the contact holes with conductive material formed therein 162 to each other. Therefore, a considerable amount of the first electrode structure 160 is located at a rear surface opposite to the direction in which light is emitted from the active layer 120, thereby increasing the luminous efficiency.

The wiring unit 163 is electrically separated from the second electrode structure 140. The first electrode structure 160 and the second electrode structure 140 include electrodes that have polarities opposite from each other to supply external power to the first conductivity type semiconductor layer 110 and the second conductivity type semiconductor layer 130, respectively. Therefore, the two electrodes must be electrically separated from each other. Electrical separation can be achieved by forming an insulating layer 180 that is formed of an insulating material, such as a dielectric.

In FIG. 4B, since the bonding unit 161 is located at the surface of the first conductivity type semiconductor layer 110, it is possible to obtain characteristics of a vertical light limiting device. In FIG. 4C, since the wiring unit 163 is located in the same plane as the second electrode structure 140, it is possible to obtain characteristics of a horizontal light emitting device. Therefore, the light emitting device 100 has a structure in which the horizontal light emitting device and the vertical light emitting device are integrated.

Referring to FIGS. 4A to 4C, the second conductivity type semiconductor layer may be a p-type semiconductor layer, and the second electrode structure may be a p-type electrode part. In this case, the first conductivity type semiconductor layer 110 may be an n-type semiconductor layer, and the first electrode structure 140 may have an n-type electrode. The first electrode structure 160 includes the bonding unit 161, the contact holes with conductive material formed therein 162, and the wiring unit 163 that are connected to each other. When the first electrode structure 140 is formed of the n-type electrode, the second electrode structure 140 may be electrically separated from the first electrode structure 160 by the insulating layer 180 that is formed of an insulating material.

Figure 5:
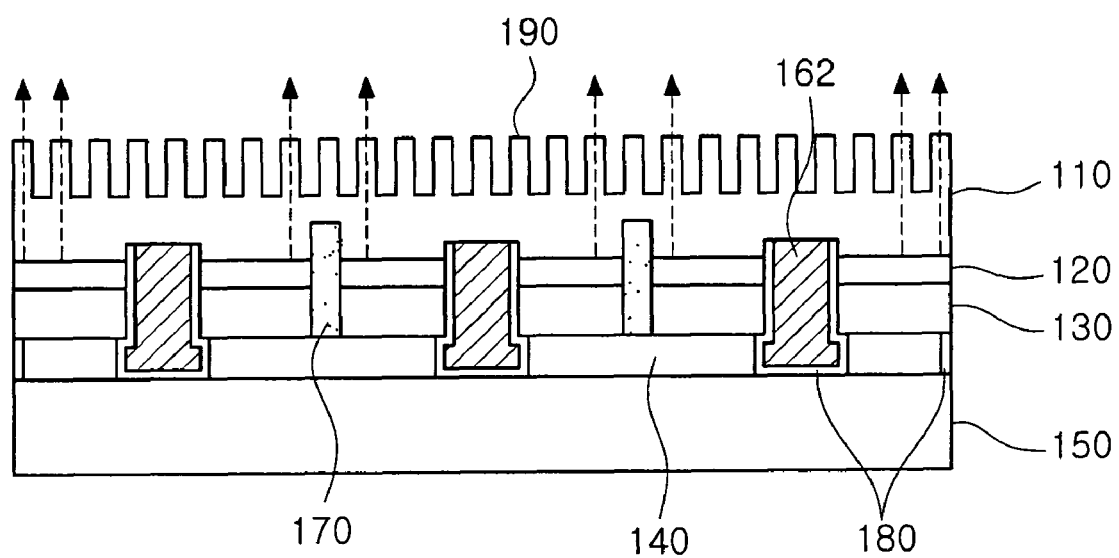
FIG. 5 is a view illustrating light emission of a light emitting device that has an irregular pattern formed at the surface thereof.

FIG. 5 is a view illustrating light emission of a light emitting device that has a surface on which an irregular pattern is formed according to another exemplary embodiment of the present invention. The light emitting device according to the embodiment of the invention includes a first conductivity type semiconductor layer 110 that forms an uppermost surface in a direction where emitted light moves. It is easy to form an irregular pattern on the surface by using a well-known method, such as photolithography. In this case, light emitted from an active layer 120 passes through an irregular pattern 190 that is formed on the first conductivity type semiconductor layer 110, and then the light is extracted. The irregular pattern 190 increases light extraction efficiency.

The irregular pattern 190 may have a photonic crystal structure. Photonic crystals contain different media that are regularly arranged like crystals. The photonic crystals can increase light extraction efficiency by controlling light in unit of length corresponding to a multiple of a wavelength of light. The photonic crystal structure may be formed according to an appropriate process after forming the first conductivity type semiconductor layer 110 and a second electrode structure 140. For example, the photonic crystal structure may be formed by an etching process.

When the irregular pattern 190 is formed on the first conductivity type semiconductor layer 110, the barrier unit 170 preferably extends to the inside of the first conductivity type semiconductor layer 110, not the surface thereof. The barrier unit 170 does not adversely affect the light extraction efficiency improved by the irregular pattern 190 and separates a light remitting region into a plurality of light emitting regions.

Figure 6:
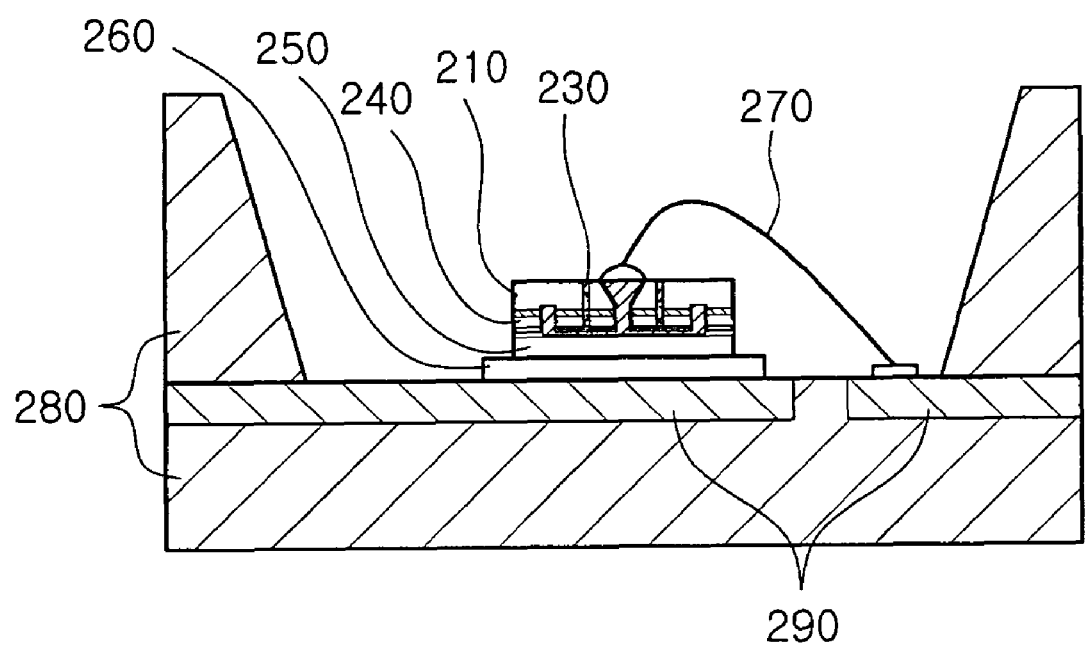
FIG. 6 is a view illustrating a package to which the light emitting device according to the embodiment of the present invention is mounted.

FIG. 6 is a view illustrating a package having the light emitting device according to the embodiment of the present invention. A cup-shaped package structure 280 has a recessed part. A conductive substrate 250 of the light emitting device is mounted to a bottom surface of the recessed part. The light emitting device includes a barrier unit 230, a light emitting lamination 210, and a second electrode structure 240 together with a first electrode structure.

The light emitting device is mounted to any one of first and second lead frames 290 that are electrode structures for electrical connections to an external current source. The conductive substrate 250 may be mounted to the lead frame 290 by die bonding. At this time, a predetermined adhesive material 260 may be used.

The light emitting device is electrically connected to the other lead frame, to which the light emitting device is not mounted, by wire bonding 270. Since the light emitting device according to the embodiment of the invention can maximize luminous efficiency and has a vertical structure, the light emitting device can be mounted by using both the die bonding and the wire bonding as shown in FIG. 6. Therefore, the process can be performed at relatively low costs.

As set forth above, according to exemplary embodiments of the invention, the light emitting device forms an electrode structure on a semiconductor layer, which is located along a light emitting direction, below an active layer, except for part of the electrode structure that is formed at a light emitting surface. Therefore, emitted light can be prevented from being reflected or absorbed by the electrode structure. Further, the maximum light emitting area can be ensured to thereby maximize luminous efficiency.

Further, since the electrode structure has at least one bonding unit and at least one contact hole with conductive material formed therein in order to facilitate uniform current spreading, uniform current spreading can be achieved by the electrode structure having a small area.

The light emitting device according to the embodiments of the invention includes a barrier unit that separates an upper surface into a plurality of regions to induce a reduction in stress between layers during a process of removing a non-conductive substrate. Therefore, characteristics of light emitting layers are stabilized, and high quality products having high reliability can be obtained because a leakage current decreases, luminous efficiency increases, a product's life span is extended.

Further, since a bonding unit is located at an upper surface of the light emitting device, alignment is unnecessary during die bonding, and wire bonding is also facilitated. Further, since the light emitting device has a vertical structure, low cost die bonding and wire bonding that are relatively easy processes can be used together when manufacturing a package. Therefore, mass production can be achieved at low cost.

Therefore, according to the embodiments of the invention, a light emitting device that enables mass production at low cost with high reliability and high quality can be realized.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting device comprising:
   a light emitting lamination including first and second conductivity type semiconductor layers and an active layer formed therebetween, and a first surface being an outside surface of the first conductivity type semiconductor layer and a second surface being an outside surface of the second conductivity type semiconductor layer;
   at least one insulating barrier unit extending from the second surface of the light emitting lamination to part of the first conductivity type semiconductor layer so as to divide the light emitting lamination into a plurality of light emitting regions;
   a first electrode structure connected to the first conductivity type semiconductor layer located at the plurality of light emitting regions;
   a second electrode structure formed at the second surface of the light emitting lamination so as to be connected to the second conductivity type semiconductor layer; and
   a conductive substrate formed at the second surface of the light emitting lamination so as to be electrically connected to the second electrode structure,
   wherein the first electrode structure includes:
   a plurality of contact holes with conductive material formed therein respectively provided in the plurality of light emitting regions and extending from the second surface of the light emitting lamination to at least part of the first conductivity type semiconductor layer and the plurality of contact holes with conductive material formed therein are electrically connected to the first conductivity type semiconductor layer and electrically insulated from the second conductivity type semiconductor layer and the active layer,
   a bonding unit connected from the first surface of the light emitting lamination to at least one of the plurality of contact holes with conductive material formed therein, and having a bonding region exposed at the first surface,
   and a wiring unit formed on the second surface of the light emitting lamination, electrically insulated from at least the second conductivity type semiconductor layer, and electrically connecting one contact hole with conductive material formed therein to another contact hole with conductive material formed therein, both one and another contact holes with conductive material formed therein connected to the bonding unit through the wiring unit.

2. The light emitting device of claim 1, wherein the barrier unit is filled with air.

3. The light emitting device of claim 1, wherein the barrier unit has an insulating layer formed at an inner surface thereof.

4. The light emitting device of claim 1, wherein the barrier unit is filled with an insulating material.

5. The light emitting device of claim 1, wherein the barrier unit extends from the second surface of the light emitting lamination to the first conductivity type semiconductor layer.

6. The light emitting device of claim 1, wherein the barrier unit includes a plurality of barriers separated from each other.

7. The light emitting device of claim 1, wherein the second electrode reflects light generated from the active layer.

8. The light emitting device of claim 7, wherein the second electrode structure includes one selected from a group consisting of Ag, Al, and Pt.

9. The light emitting device of claim 1, wherein the conductive substrate includes one selected from a group consisting of Au, Ni, Cu, and W.

10. The light emitting device of claim 1, wherein the conductive substrate includes one selected from a group consisting of Si, Ge, and GaAs.

11. The light emitting device of claim 1, wherein the conductive substrate is formed by using a plating method.

12. The light emitting device of claim 1, wherein the conductive substrate is formed by using a substrate bonding method.

13. The light emitting device of claim 1, wherein the bonding unit has a smaller cross-sectional area in the active layer than in a surface of the first conductivity type semiconductor layer.

14. The light emitting device of claim 1, wherein the contact holes are separated from the bonding unit by a predetermined distance.

15. The light emitting device of claim 1, wherein a cross-sectional area of each contact hole in the active layer is smaller than that of the bonding unit in the first conductivity type semiconductor layer.

16. A light emitting device package comprising:
   a light emitting device package body having a recessed part at an upper surface thereof;
   a first lead frame mounted to the package body and exposed at a lower surface of the recessed part;
   a second lead frame mounted to the package body; and
   a light emitting device mounted to the first lead frame, wherein the light emitting device comprises a light emitting lamination including first and second conductivity type semiconductor layers and an active layer formed therebetween, and a first surface being an outside surface of the first conductivity type semiconductor layer and a second surface being an outside surface of the second conductivity type semiconductor layer;

at least one insulating barrier unit extending from the second surface of the light emitting lamination to part of the first conductivity type semiconductor layer so as to divide the light emitting lamination into a plurality of light emitting regions;

a first electrode structure connected to the first conductivity type semiconductor layer located at the plurality of light emitting regions; a second electrode structure formed at the second surface of the light emitting lamination so as to be connected to the second conductivity type semiconductor layer; and a conductive substrate formed at the second surface of the light emitting lamination so as to be electrically connected to the second electrode structure, and the first electrode structure includes:

a plurality of contact holes with conductive material formed therein respectively provided in the plurality of light emitting regions and extending from the second surface of the light emitting lamination to at least part of the first conductivity type semiconductor layer so that the plurality of contact holes with conductive material formed therein are electrically connected to the first conductivity type semiconductor layer and electrically insulated from the second conductivity type semiconductor layer and the active layer, a bonding unit connected from the first surface of the light emitting lamination to at least one of the plurality of contact holes with conductive material formed therein, and having a bonding region exposed at the first surface, and a wiring unit formed on the second surface of the light emitting lamination, electrically insulated from at least the second conductivity type semiconductor layer, and electrically connecting one contact hole with conductive material formed therein to another contact hole with conductive material formed therein, both one and another contact holes with conductive material formed therein connected to the bonding unit through the wiring unit.

* * * * *